United States Patent [19]

Takashima

[11] Patent Number: 5,731,586
[45] Date of Patent: Mar. 24, 1998

[54] MAGNETIC-ELECTROSTATIC COMPOUND OBJECTIVE LENS

[75] Inventor: Susumu Takashima, Tokyo, Japan

[73] Assignee: JEOL Ltd., Tokyo, Japan

[21] Appl. No.: 652,383

[22] Filed: May 23, 1996

[51] Int. Cl.⁶ .................................................. H01J 37/145
[52] U.S. Cl. ........................... 250/396 ML; 250/396 R
[58] Field of Search .................. 250/396 R, 396 ML, 250/398

[56] References Cited

U.S. PATENT DOCUMENTS

| | | | |
|---|---|---|---|
| 4,525,629 | 6/1985 | Morita et al. | 250/396 ML |
| 4,831,266 | 5/1989 | Frosien et al. | 250/396 ML |
| 5,041,731 | 8/1991 | Oae et al. | 250/396 ML |
| 5,097,125 | 3/1992 | Gruen | 250/396 R |
| 5,412,209 | 5/1995 | Otaka et al. | 250/396 ML |
| 5,444,256 | 8/1995 | Nagai et al. | 250/398 |

OTHER PUBLICATIONS

"Compound magnetic and electrostatic lenses for low-voltage applications", J. Frosien, E. Plies and K. Anger, *J. Vac. Sci. Technol. B*, vol. 7, No. 6, Nov./Dec. 1989.

*Primary Examiner*—Bruce Anderson
*Attorney, Agent, or Firm*—Webb Ziesenheim Bruening Logsdon Orkin & Hanson, P.C.

[57] ABSTRACT

There is disclosed a high-resolution magnetic-electrostatic compound objective lens for use in a scanning electron microscope, the objective lens having reduced spherical aberration and chromatic aberration. The lens comprises a substantially conically-shaped magnetic pole piece, a coil wound along the inner surface of the magnetic pole piece, a hollow insulator disposed along the inner surface of the coil and a high-resistivity film disposed along the inner surface of the insulator. When the coil is energized, an axially symmetrical magnetic field is produced inside the magnetic lens. The obtained axial magnetic flux density distribution has a peak near the bottom end of the magnetic pole piece. The principal plane of the magnetic lens is brought close to the specimen and results in smaller aberrations. When a high voltage is applied to the high-resistivity film from a voltage source, a feeble electrical current flows from the top end of the film to the bottom end, thus producing a voltage drop in the longitudinal direction of the film. Since the shape and the thickness of the high-resistivity film are symmetrical with respect to the optic axis, the equipotential surface is axially symmetrical.

9 Claims, 9 Drawing Sheets

MAGNETIC-ELECTROSTATIC COMPOUND OBJECTIVE LENS

FIELD OF THE INVENTION

The present invention relates to a high-resolution magnetic-electrostatic compound objective lens best adapted for use in a scanning electron microscope or the like.

BACKGROUND OF THE INVENTION

In recent years, semiconductor devices have been fabricated in smaller sizes and with growing complexity. With this trend, the necessity of observing large-sized flat objects such as wafers and masks from every direction has increased during inspection of the shapes of these devices. This inspection is one of the steps carried out for fabrication of the devices. As a scanning electron microscope objective lens which satisfies this requirement, we have already put an objective lens into practical use, as described in Japanese Patent Laid-Open No. 298566/1989. This objective lens has produced some desirable results.

This known objective lens is shown in FIG. 1, where a conic bobbin 1 is provided with a hole P for permitting passage of an electron beam. Also shown are a coil 2, a yoke 3, and a flat specimen 4, such as a wafer. The specimen 4 is tilted along the yoke 3. In this structure, the coil 2 is wound in several layers on the outer periphery of the conic bobbin 1. Each different layer has a different number of turns of wire. As a consequence, the density of the turns of the wire of the coil along the axis of the coil is made larger on the exit side of the objective lens than on the incident side. This permits the principal plane of the lens and peak of the axial magnetic flux density distribution to be brought closer to the specimen 4.

A modification of the structure shown in FIG. 1 is depicted in FIG. 2. It is to be noted that like components are indicated by like reference numerals in various figures. In this configuration of FIG. 2, a funnel-shaped bobbin 5 is provided. The coil 2 is wound in several layers on the outer periphery of the funnel-shaped bobbin 5 as indicated by the hatching. The number of turns of wire of the coil 2 is made different for each different layer so that the outer surface of the coil 2 is shaped like a conical form. Therefore, the density of turns of the wire along the axis of the coil 2 is decreased toward the incident side of the objective lens and also toward the exit side.

In the axial magnetic flux density distribution created by the objective lens shown in FIG. 2, the principal plane of the lens and the position of the peak of the axial magnetic flux density are closer to the specimen 4 than in the axial magnetic flux density distribution created by the objective lens shown in FIG. 1. Hence, the performance of the lens is further improved.

In the objective lenses shown in FIGS. 1 and 2, the profile of each objective lens is shaped like a truncated cone having a vertical angle of 60°. The specimen can be tilted at an angle of up to 60°. In this configuration, the principal plane of the objective lens is brought as close as possible to the top surface of the truncated cone. As is well known in the art, the aberration of a magnetic lens decreases as the principal plane of the lens approaches the specimen. Therefore, the above-described lens can accomplish small aberration even when the specimen is tilted at an angle of 60°.

However, the device density of semiconductors has been increased rapidly. Therefore, scanning electron microscopes have been required to exhibit higher resolutions. FIG. 3 is a cross-sectional view of a recently proposed magnetic-electrostatic compound objective lens. This lens makes use of superimposition of a magnetic lens and a retarding bipotential electrostatic lens. This compound objective lens is described by J. Frosien, E. Plies and K. Anger in an article entitled "Compound magnetic and electrostatic lenses for low-voltage applications", *J. Vac. Sci. Technol.* B Vol. 7, No. 6, November Decemeber 1989.

Referring to FIG. 3, the magnetic lens consists of a bottom pole piece 6 and a top pole piece 7. Indicated by numeral 8 is a coil. One electrode 9 of the electrostatic lens is located inside the top pole piece 7 of the magnetic lens, and takes the form of a conical cylinder. The other electrode 10 of the electrostatic lens is mounted at the front end of the bottom pole piece 6. A voltage (not shown) is applied between the electrodes 9 and 10.

FIG. 3 shows a cross section of the objective lens. In practice, the cross section is symmetrical horizontally. In the left portion of the cross section, the equipotential distribution lines of the electrostatic lens are shown. In the right portion, the distribution of lines of magnetic force is shown.

With this lens, the specimen can be tilted at an angle of up to 50° at a distance of $(4+\alpha)$ mm from the front end of the electrode 10, where $\alpha$ is a mechanical clearance for preventing the specimen from touching the outer wall when the specimen is tilted at an angle of 50°. Where the working distance (WD) is 4 mm, for example, if the retardation ratio $V_1/V_0$ is set to 1/17, then this lens produces a spherical aberration $Cs=3.7$ mm and a chromatic aberration $Cc=1.8$ mm, where $V_1$ is the acceleration voltage of the electron beam (i.e., the potential at the specimen as viewed from the emitter) which is the potential at the magnetic pole of the magnetic lens and $V_0$ is an intermediate accelerating voltage that is the potential at the electrode 9 of the electrostatic lens.

The aberration of the objective lens of the construction shown in FIG. 3 is only about one tenth of the aberrations of the lenses shown in FIGS. 1 and 2. Although the performance of the lens shown in FIG. 3 is high in this way, the lens has the following disadvantages. First, the specimen can be tilted at an angle of up to only about 50°. As the maximum tilt angle is increased, a larger amount of information can be obtained from the scanning electron microscope. It is considered that the tilt angle of 50° is insufficient. It is desired that the specimen be tilted at an angle of up to about 60°.

Secondly, it is impossible to redesign the instrument in such a way that the specimen can be tilted at an angle of up to 60°, for the following four reasons.

(1) Where the cone angle of the bottom pole piece 6 is set to 60° in such a way that the inside diameter of the top pole piece 7 and the front end position are kept fixed, the front end of the top pole piece 7 is too close to the bottom pole piece 6. As a result, magnetic saturation occurs at a relatively low excitation. Consequently, the maximum usable accelerating voltage is lowered.

(2) If the front end of the top pole piece 7 is moved upward for the reason (1) above, it is possible to circumvent the magnetic saturation. However, the principal plane of the magnetic lens is shifted upward, thus deteriorating the performance of the magnetic-electrostatic compound objective lens.

(3) If the inside diameter of the top pole piece 7 is reduced for the reason (1), then the magnetic saturation can be prevented again. However, an electric discharge occurs easily, because the top pole piece 7 is located closer to the electrode 9 that is at a high potential. Hence, the lens is made unpractical. Furthermore, if the inside diameter of the electrode 9 is reduced, then electric discharge can be circumvented but the performance of the electrostatic lens deteriorates greatly.

(4) If the potential $V_0$ at the electrode 9 is lowered for the reason (3) above, then electric discharge can be prevented. However, the retardation ratio $V_1/V_0$ increases. This deteriorates the performance of the lens severely.

Thirdly, the performance of the magnetic lens alone is lower than the performances of the magnetic lenses shown in FIGS. 1 and 2. In the lens shown in FIG. 3, the voltage-to-ground ($V_0-V_1$) at the electrode 9 is kept constant, taking account of the withstand voltage of the electrode 9. Therefore, if the accelerating voltage $V_1$ is increased, then the retardation ratio $V_1/V_0$ increases. For example, where $V_1=500$ V and $V_0-V_1=8$ kV, it follows that $V_1/V_0=1/17$. Where $V_1=15$ kV, the voltage-to-ground ($V_0-V_1$) increases to $15/23=1/1.53$. At this time, the performance of the compound lens is close to the performance of the magnetic lens alone. This is a natural consequence because the magnetic lens shown in FIG. 3 assumes the conventional shape adopted before emergence of the lenses having the shapes shown in FIGS. 1 and 2. That is, the magnetic lens is not designed to exhibit its maximum performance when tilted at an angle of 50°.

FIG. 4 is a graph showing variations of the spherical aberration Cs and chromatic aberration Cc of a magnetic-electrostatic compound objective lens when the accelerating voltage $V_1$ is changed from 0.5 kV to 15 kV while maintaining the voltage-to-ground ($V_0-V_1$) at the electrode 9 at 8 kV. In this graph, two curves are drawn for each of the aberrations Cs and Cc. Curve A indicates the variations created when a specimen was placed at the intersection of the top of the cone and the optic axis (working distance WD=4 mm). Curve B indicates the variations created when the specimen was shifted downward from this position by 2 mm.

In FIG. 4, the dot-and-dash lines indicate the values of the spherical aberration Cs and chromatic aberration Cc of the lens constructed as shown in FIG. 1 at a position where a tilt of 60° is possible, including the mechanical clearance. As can be seen from this graph, where the accelerating voltage is more than 4.4 kV, the spherical aberration Cs is poorer than the spherical aberration Cs of the lens of FIG. 1, because the performance of the cooperating magnetic lens is poor.

SUMMARY OF THE INVENTION

In view of the foregoing, the present invention has been made. It is an object of the present invention to provide a high-resolution, magnetic-electrostatic compound objective lens having reduced aberrations Cs and Cc.

This object is achieved by a magnetic-electrostatic compound objective lens for use in an instrument having an electron beam path, the objective lens comprising a substantially conically-shaped magnetic pole piece surrounding the electron beam path, a coil wound along the inner surface of the magnetic pole piece, a hollow insulator disposed along the inner surface of the coil, a high-resistivity body disposed along the inner surface of the insulator and a voltage application means. The high-resistivity body has two ends which are spaced from each other along the electron beam path. The voltage application means applies a voltage between the two ends of the high-resistivity body to produce an electric field for retarding electrons. In this structure, an electrostatic lens action occurs at a position closer to a specimen than the position of the peak of the magnetic flux density produced by the magnetic lens.

In one aspect of the invention, the high-resistivity body of this magnetic-electrostatic compound objective lens assumes the form of a film.

In another aspect of the invention, the high-resistivity body of this magnetic-electrostatic compound objective lens is shaped like a pipe with finite thickness.

In a further aspect of the invention, a plurality of ring-shaped conductors are disposed inside the high-resistivity body of this magnetic-electrostatic compound objective lens, thus compensating for disturbance of the equipotential surface due to a nonuniformity of the high-resistivity body.

The above object is also achieved by a magnetic-electrostatic compound objective lens for use in an instrument having an electron beam path, the objective lens comprising a substantially conically-shaped magnetic pole piece surrounding the electron beam path, a coil wound along the inner surface of the magnetic pole piece, a hollow insulator disposed along the inner surface of the coil, a lamination disposed along the inner surface of the insulator, and a voltage application means. The lamination consists of ring-shaped high-resistivity members and conductive members alternately stacked on top of each other. The lamination has two ends which are spaced from each other along the electron beam path. The voltage application means applies a voltage between the two ends of the lamination to produce an electric field for retarding electrons. An electrostatic lens action occurs at a position closer to a specimen than the position of the peak of the magnetic flux density produced by the magnetic lens.

The above object is also achieved by a magnetic-electrostatic compound objective lens for use in an instrument having an electron beam path, the objective lens comprising a substantially conically-shaped magnetic pole piece surrounding the electron beam path, a coil wound along the inner surface of the magnetic pole piece, a hollow insulator disposed along the inner surface of the coil, a lamination disposed along the inner surface of the insulator and a voltage application means. The lamination consists of a number of ring-shaped high-resistivity members and metal members alternately stacked on top of each other. The lamination has two ends which are spaced from each other along the electron beam path. The voltage application means applies a voltage between the two ends of the lamination to produce an electric field for retarding electrons. An electrostatic lens action occurs at a position closer to a specimen than the position of the peak of the magnetic flux density produced by the magnetic lens.

In still another aspect of the invention, heat-dissipating material is disposed between the coil and the high-resistivity body or lamination of any one of the magnetic-electrostatic compound objective lenses described above to effectively dissipate heat from the coil.

In yet another aspect of the invention, the substantially conically-shaped magnetic pole piece body of any one of the magnetic-electrostatic compound objective lenses described above has a cone angle of about 60°.

BRIEF DESCRIPTION OF THE DRAWINGS

Further features and other objects and advantages of the invention will be apparent from the following detailed description made with reference to the drawings in which.

DETAILED DESCRIPTION OF THE INVENTION

Figure 5:
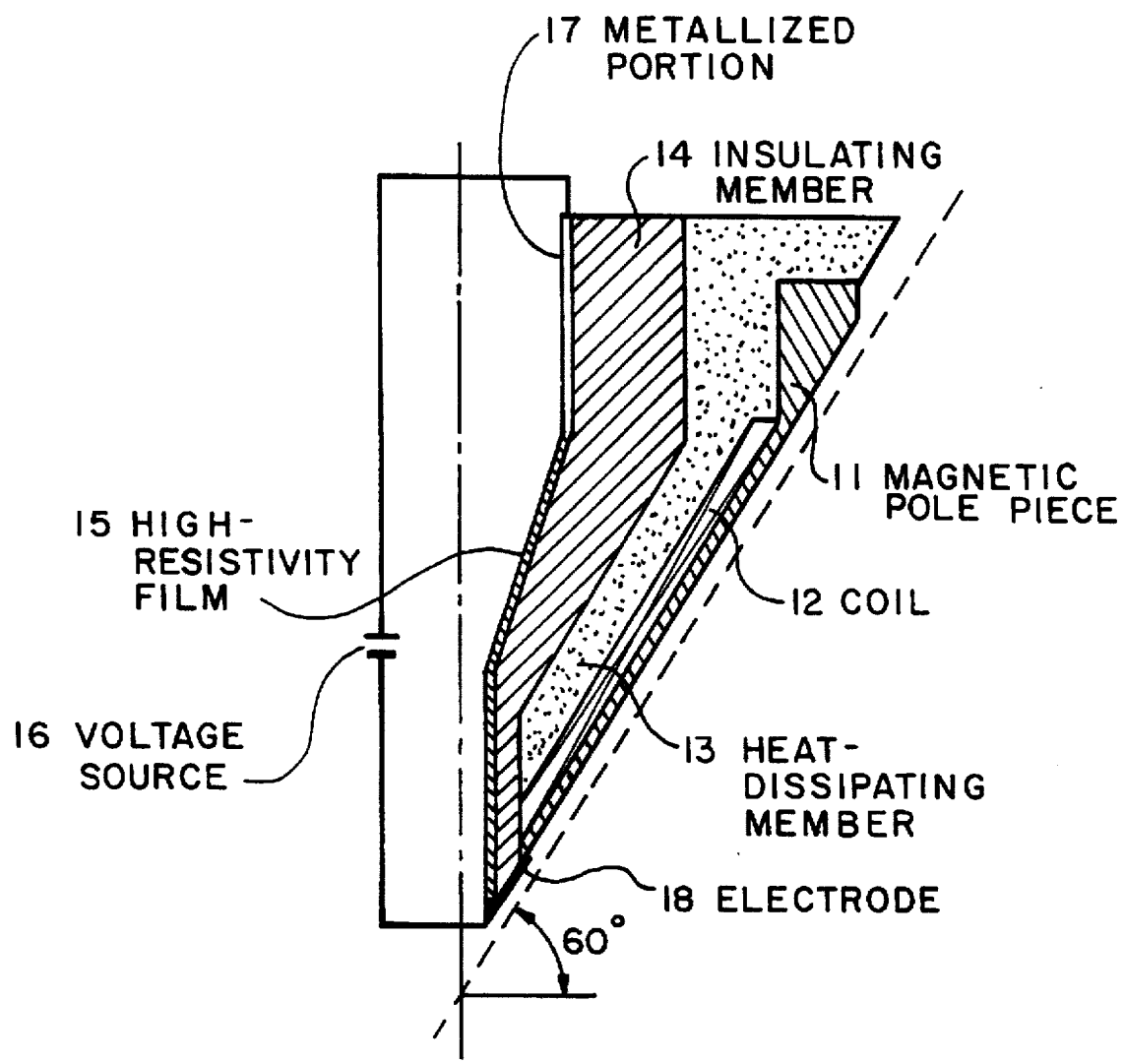
FIG. 5 is a fragmentary cross section of a magnetic-electrostatic compound objective lens according to the present invention.

Referring to FIG. 5, there is shown a magnetic-electrostatic compound objective lens embodying the concept of the present invention. This lens has a conic, thin-walled, magnetic pole piece 11 made of a magnetic substance. The vertical angle of the cone of the magnetic pole piece 11 is approximately 60°. A coil 12 is wound in layers along the inner wall of the magnetic pole piece 11. A heat-dissipating member 13 made of copper or other material is disposed inside the coil 12 and forms a bobbin for the coil 12. The heat-dissipating member 13 also forms a heat-dissipating path. The magnetic pole piece 11, coil 12 and heat-dissipating member 13 cooperate to form a conic magnetic lens.

A hollow insulating member 14 made of a ceramic or the like is mounted inside the heat-dissipating member 13 coaxially with the conic magnetic lens. A film 15 consisting of a high-resistivity material such as silicon carbide is formed inside the insulating member 14. A voltage is applied across the film 15 from a voltage source 16. As a result, a high voltage is applied to the top end of the high-resistivity film 15 on the side of the electron gun (not shown). The bottom end of the high-resistivity film 15 which is on the side of the specimen is at ground potential. Alternatively, a low voltage is impressed on the bottom end of the film 15.

The insulating member 14 has a metallized upper portion 17 on the inner wall. An electrode 18 connected with the high-resistivity film 15 is mounted at the bottom end of the insulating member 14. In practice, the metallized portion 17 and the electrode 18 are connected with the voltage source 16. The operation of this structure is described below.

Figure 6:
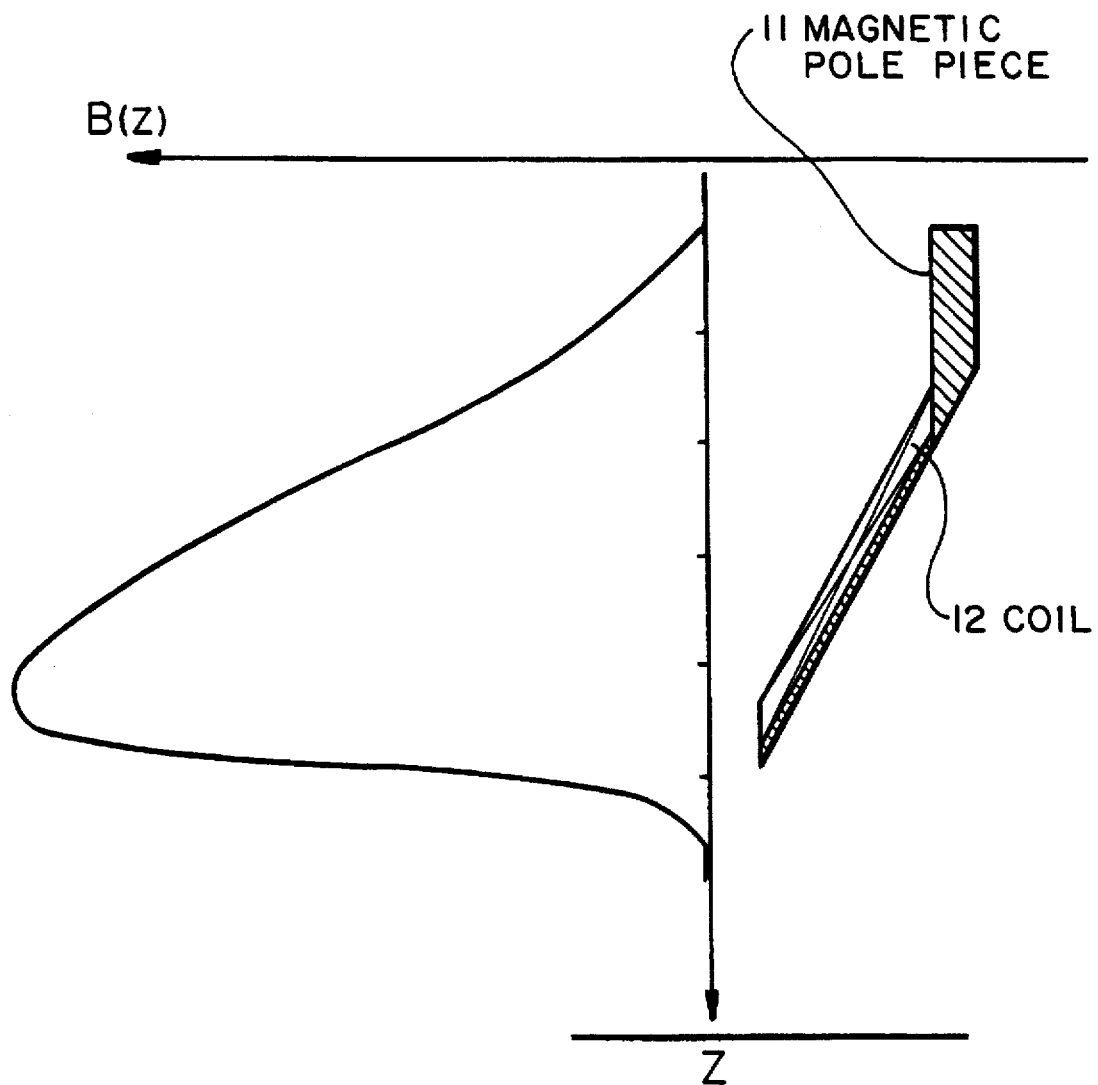
FIG. 6 is a diagram showing the axial magnetic flux density created by the objective lens shown in FIG. 5.

When the coil 12 is energized, an axially symmetrical magnetic field is produced inside the magnetic lens. The obtained distribution of the axial magnetic flux density B(z) has a peak near the bottom end of the magnetic pole piece 11, as shown in FIG. 6. Therefore, the principal plane of the magnetic lens is located closer to the specimen positioned under the lens. The resulting aberration is smaller than the aberration of the magnetic lens, for example, of FIG. 3 operated alone.

Figure 7:
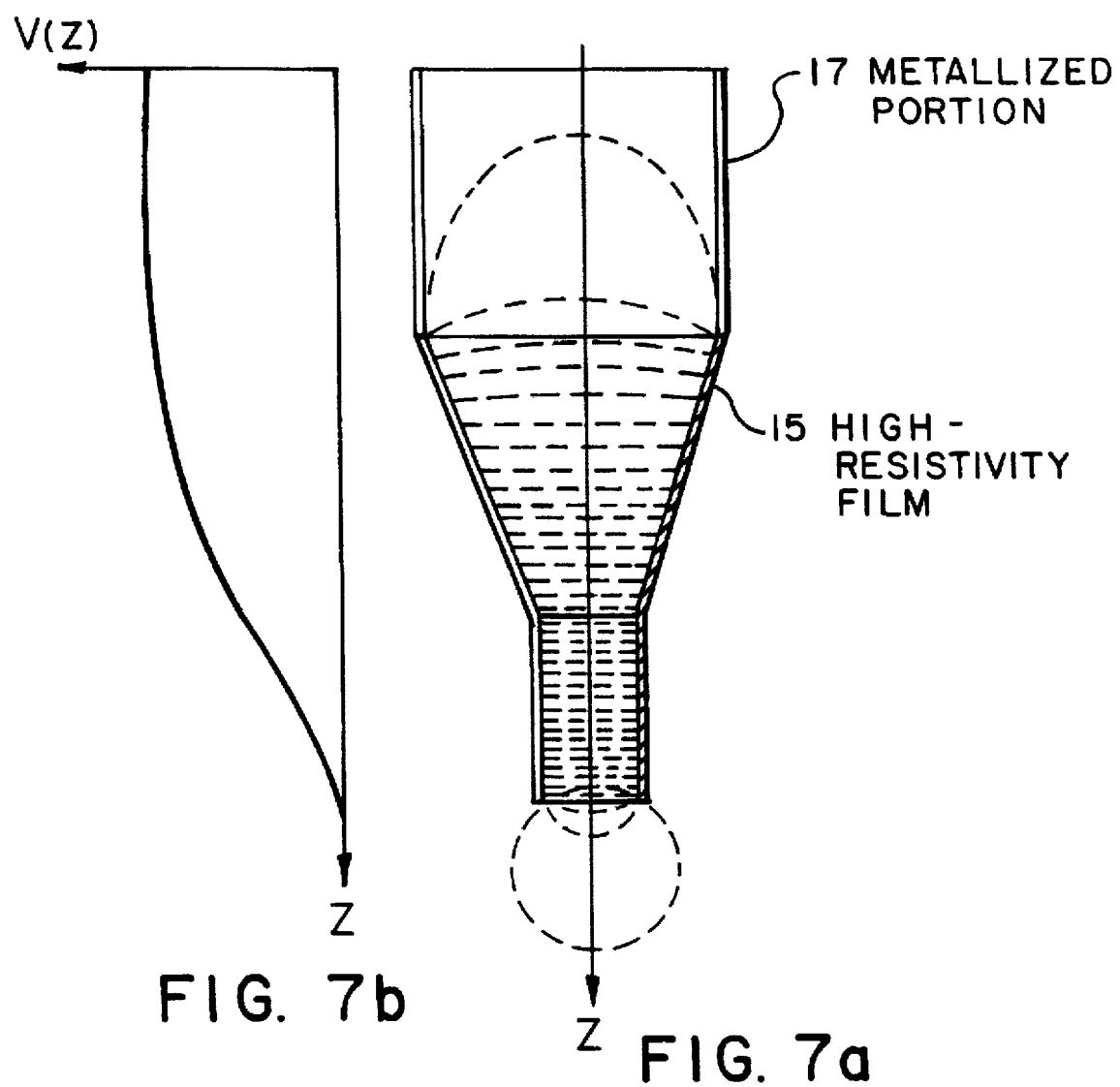
FIGS. 7(a) and 7(b) are diagrams showing a cross section of a high-resistivity body included in the lens shown in FIG. 5, also showing equipotential lines and on-axis potentials inside the high-resistivity body.

When a high voltage is applied to the high-resistivity film 15 from the voltage source 16, a feeble current flows from the top end to the bottom end of the film 15, thus inducing a voltage drop in the longitudinal direction of the high-resistivity film 15, or along the optic axis of the electron beam. Since the shape and thickness of the high-resistivity film 15 are symmetrical with respect to the optic axis, the equipotential surface is axially symmetrical. The equipotential lines in the space formed in the high-resistivity film 15 are shown in FIG. 7(a). The axial potential distribution in the space is shown in FIG. 7(b).

Figure 8:
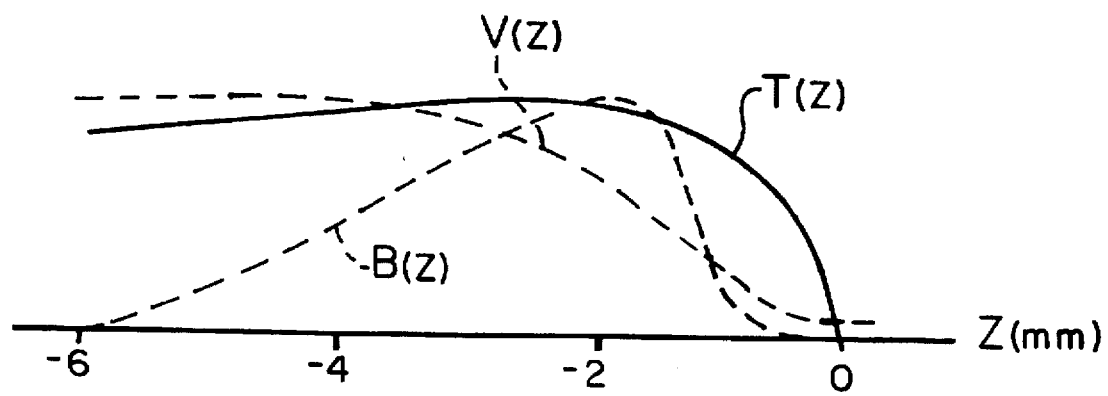
FIG. 8 is a diagram illustrating the axial magnetic flux density B(z), the axial potential V(z) and the electron trajectory T(z) of the lens shown in FIG. 5.

FIG. 8 shows an example of the axial magnetic flux density B(z), the axial potential V(z) and the electron trajectory T(z) when an electric field and a magnetic filed are simultaneously excited by the configuration shown in FIG. 5. In this example of FIG. 8, the voltage-to-ground $V_1$ applied to the top end of the high-resistivity film 15 is set to 7 kV, the voltage-to-ground $V_2$ applied to the bottom end of the film 15 is set to 0 V and the accelerating voltage $V_1$ is set to 500 V.

In this graph, Z=0 indicates the position at which the specimen, including the mechanical clearance, can tilt at an angle of up to 60°. At this time, the required excitation of the coil 12 is approximately 500 AT. In this example, the spherical aberration Cs and chromatic aberration Cc are 8.0 mm and 3.6 mm, respectively, which are comparable to the values obtained when the accelerating voltage $V_1$ of the lens of FIG. 3 is 0.5 kV and $\alpha$=+2.

Figure 1:
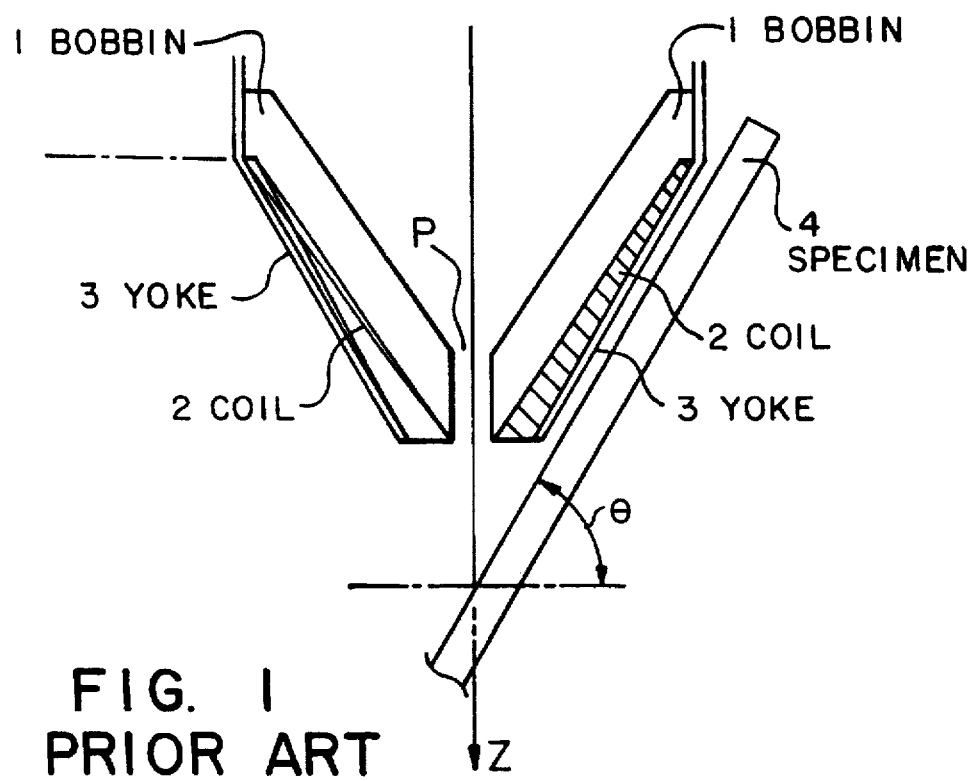
FIG. 1 is a cross section of a known conical objective lens for use in a scanning electron microscope.
Figure 2:
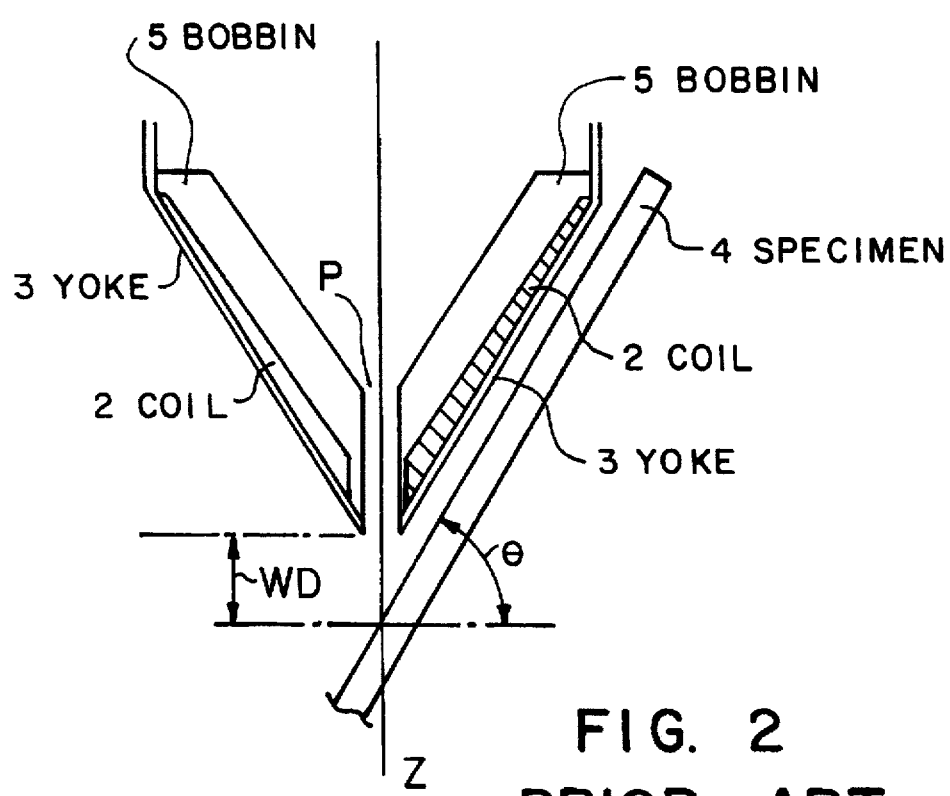
FIG. 2 is a cross section similar to FIG. 1, but showing a modification of the objective lens shown in FIG. 1.
Figure 3:
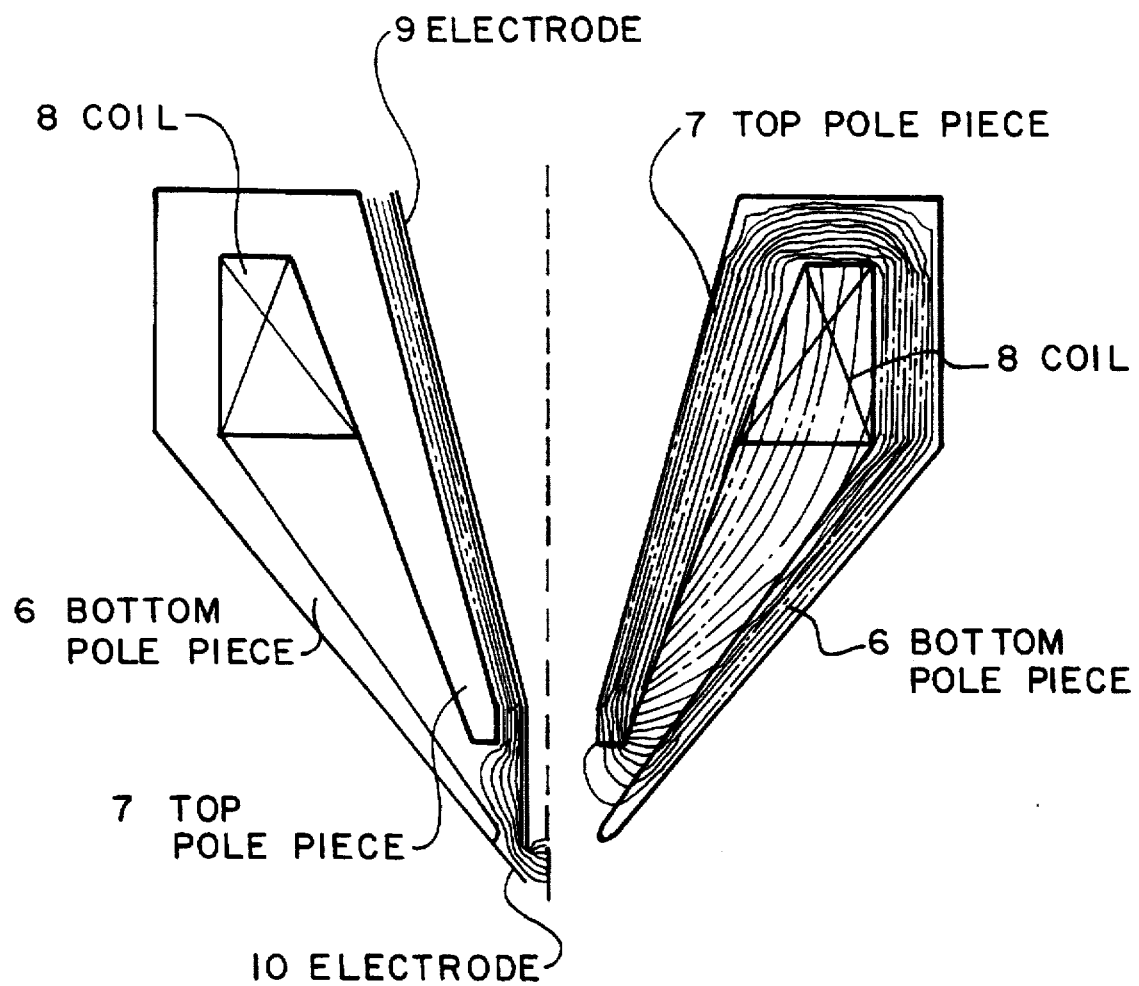
FIG. 3 is a cross section of a known magnetic-electrostatic compound objective lens.
Figure 4:
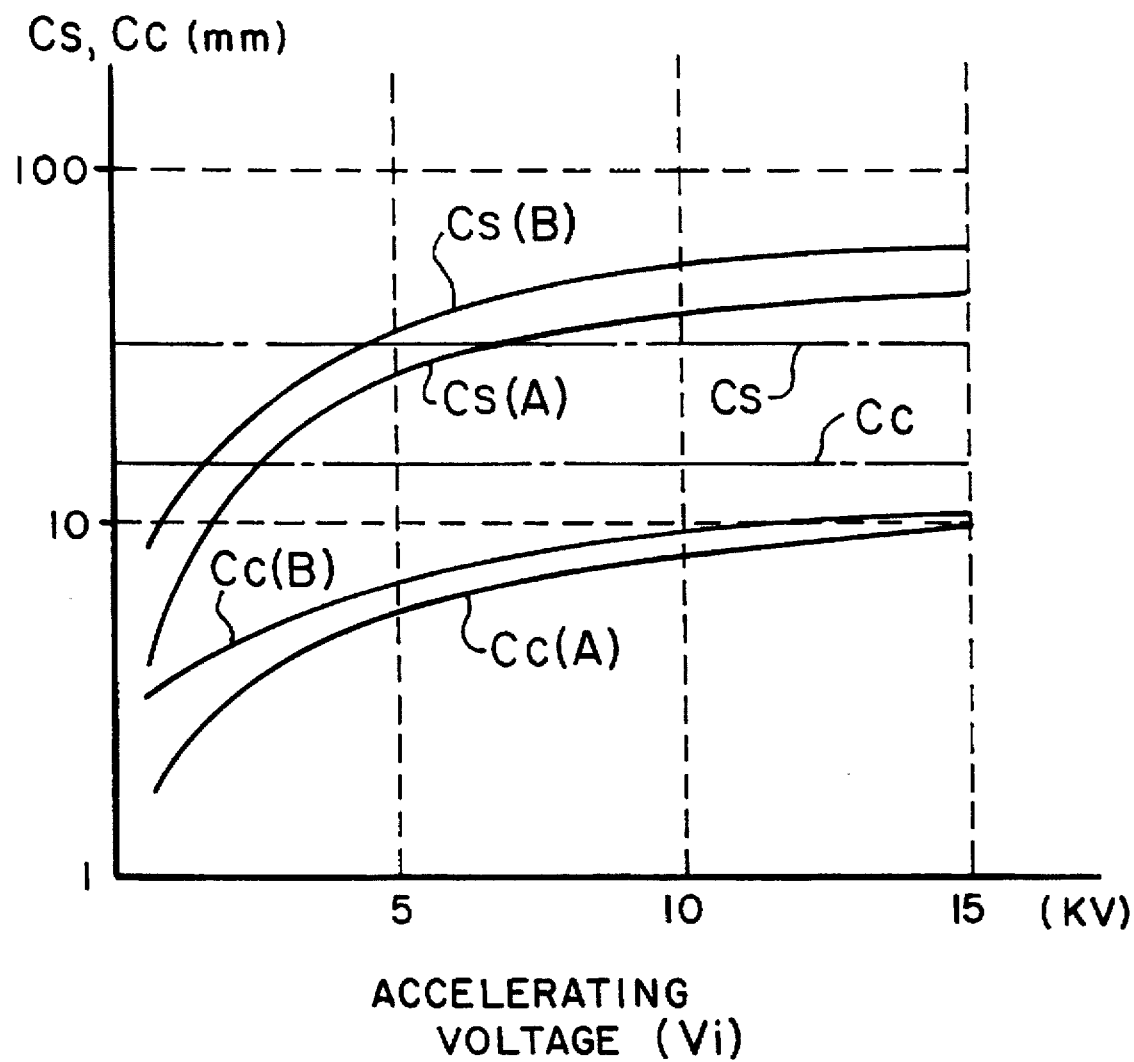
FIG. 4 is a graph in which the spherical aberration Cs and chromatic aberration Cc of the objective lens shown in FIG. 3 are plotted against the accelerating voltage of a scanning electron microscope in which the lens is used.
Figure 9:
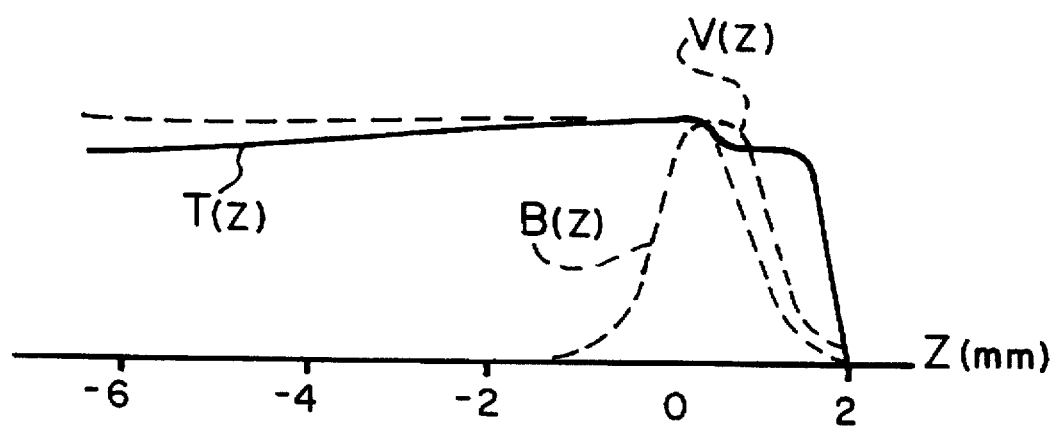
FIG. 9 is a diagram illustrating the axial magnetic flux density B(z), the axial potential V(z) and the electron trajectory T(z) of the lens shown in FIG. 3.

The axial magnetic flux density B(z), the axial potential V(z) and the electron trajectory T(z) of the lens shown in FIG. 3 are shown in FIG. 9. As can be seen from this graph, an electric field is developed only between the electrodes at the front end of the lens. The forward half of this electric field acts as a diverging lens. By the action of this lens, the height of the electron trajectory from the optic axis is once increased radially. Then, the trajectory is converged onto the specimen by the focusing action of the latter half of the field.

On the other hand, the potential distribution of the lens shown in FIG. 5 is distributed over a wide range of the z-axis, as can be seen from FIG. 8. The diverging action of this lens is quite small and can be hardly recognized in the example of FIG. 8. As is well known in the art, the spherical aberration of an electron lens contains a component which is in proportion to the fourth power of the trajectory height and so the electron lens shown in FIG. 5 has a smaller spherical aberration than does the electrostatic lens with a gap as shown in FIG. 3.

In the case of an electrostatic lens with a gap, one would consider that it is possible to widen the range of the electric field by increasing the spacing between the top and bottom pole pieces. In practice, however, this is impossible to achieve, for the following reason. A magnetic lens at the same potential as the bottom pole piece exists around the gap and most of the voltage drop occurs in the vicinity of the front end of the top pole piece. Accordingly, if the top pole piece is raised so as to widen the gap, the resulting effect is equivalent to moving the whole electrostatic lens away from the specimen, thus deteriorating the performance greatly.

As can be seen from FIGS. 8 and 9, the electrostatic lens produces a focusing action because primary electrons are sufficiently decelerated. In particular, the focusing action by the electrostatic lens occurs near the electrode 18 shown in FIG. 5 and also near the electrode 10 shown in FIG. 3. Since these positions are located closer to the specimen than the peak position of the magnetic flux density, the focal distance of the compound lens is shortened. This greatly improves the aberration coefficients.

Figure 10:
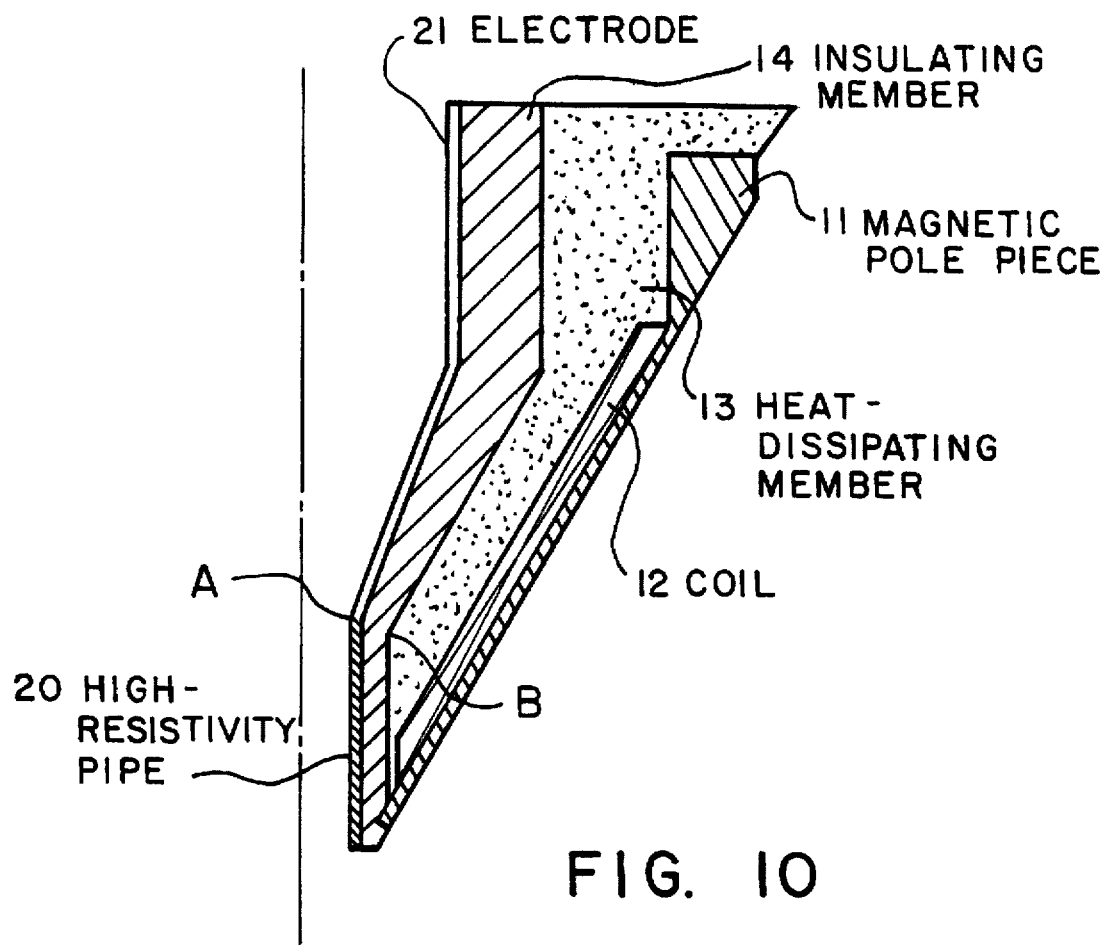
FIG. 10 is a cross section similar to FIG. 5, but showing another magnetic-electrostatic compound objective lens according to the present invention.

Referring next to FIG. 10, there is shown another magnetic-electrostatic compound objective lens according to the invention. It is to be noted that like components are indicated by like reference numerals in various figures and that those components which have been already described will not be described below. This compound objective lens is similar to the compound objective lens described previously in connection with FIG. 5 except that a cylindrical pipe 20 of high resistivity is disposed inside the insulating member 14 instead of the high-resistivity film and that an electrode 21 is mounted at a higher position inside the insulating member 14. The electrode 21 is formed by metallizing the inner surface either of a metal electrode or of an insulator.

The specific resistance or resistivity of the material of the cylindrical pipe 20 of high resistivity is about $10^8$ to $10^{11}$ $\Omega$. cm. This material is obtained, for example, by mixing conductive particles into a ceramic and sintering the mixture. This material of high resistivity is stable within air and resistant to formation of an insulating oxide layer. If scattered electrons collide against the high-resistivity material, it is not charged.

In the example shown in FIG. 10, only the straight cylindrical portion is formed by the high-resistivity pipe 20 and so it is easy to manufacture the compound objective lens. Of course, this advantage is also obtained by using a high-resistivity film instead of the high-resistivity pipe 20. In the configuration of FIG. 10, the electric field is strongest in the space between locations A and B. This space is filled with an insulator of uniform quality, thus producing a higher withstand voltage than a vacuum gap. Accordingly, a high voltage can be applied across a narrower space than in the case where a vacuum gap is used. Consequently, a lens having a small retardation ratio $V_1/V_0$ is made practical.

Figure 11:
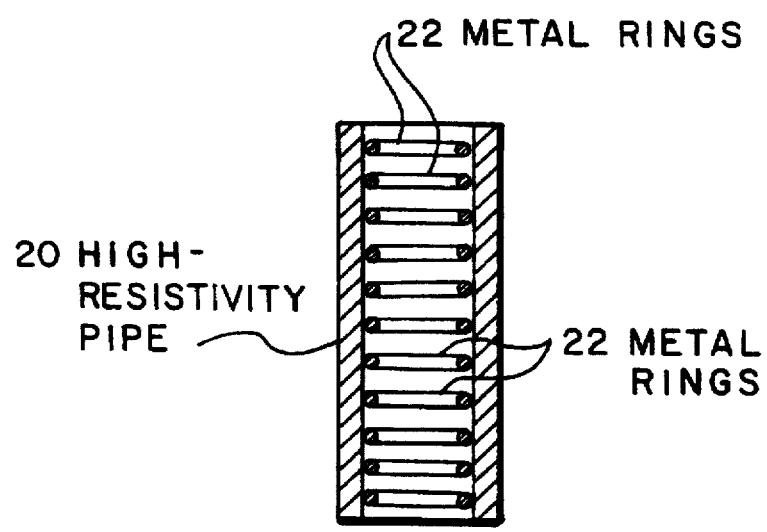
FIG. 11 is a cross section of a further high-resistivity pipe used in a magnetic-electrostatic compound objective lens according to the invention.

Referring next to FIG. 11, there is shown a further high-resistivity pipe 20 for use in a magnetic-electrostatic compound objective lens according to the invention. A plurality of metal rings 22 for correcting the electric field are mounted parallel to each other inside the pipe 20. The high-resistivity pipe 20 may not develop an electric field accurately axially symmetrically because the thickness or material is not uniform. In this example, the metal rings 22 arranged parallel axially symmetrically compensate for disturbance of the equipotential surface caused by nonuniformity of the high-resistivity material. When the metal rings 22 are fabricated, a thin-walled metal pipe is fitted in the high-resistivity pipe 20 and then the rings are cut off from each other with a given pitch.

Figure 12:
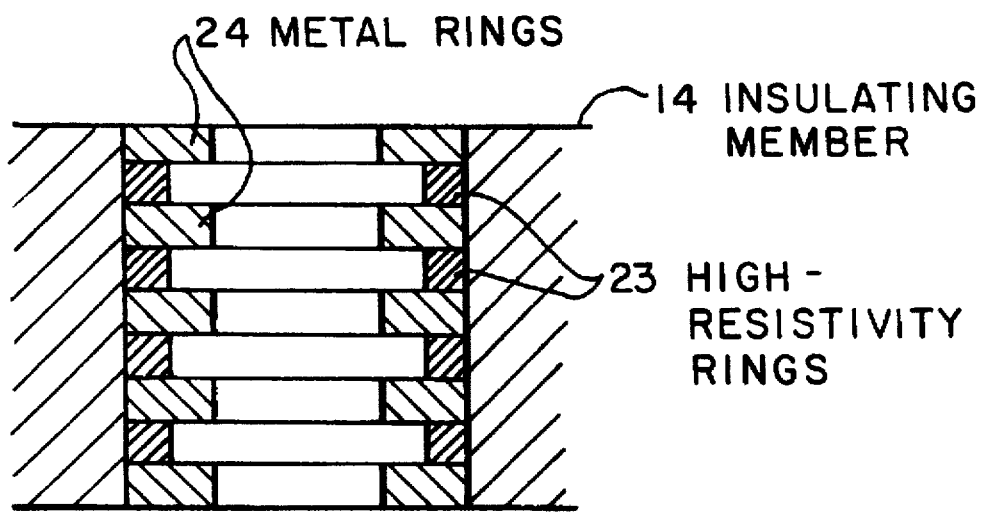
FIG. 12 is a cross section of yet another high-resistivity pipe used in a magnetic-electrostatic compound objective lens according to the invention.

Referring next to FIG. 12, there is shown yet another high-resistivity pipe for use in a magnetic-electrostatic compound objective lens according to the invention. High-resistivity rings 23 and metal rings 24 are alternately stacked on top of each other inside an insulating member 14 to produce the same effect as the high-resistivity film 15 shown in FIG. 5 and the high-resistivity pipe 20 shown in FIG. 10.

Figure 13:
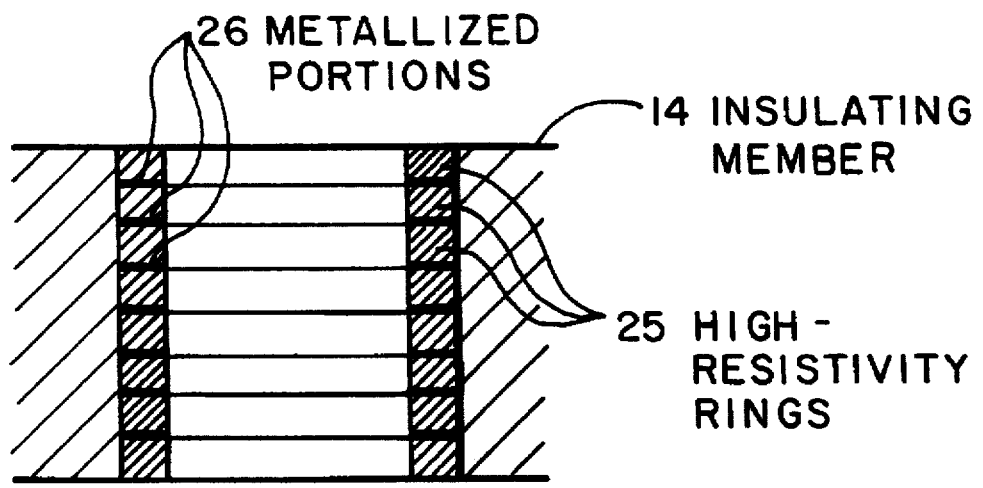
FIG. 13 is a cross section of still another high-resistivity pipe used in a magnetic-electrostatic compound objective lens according to the invention.

Referring next to FIG. 13, there is shown still another high-resistivity pipe for use in a magnetic-electrostatic compound objective lens according to the invention. High-resistivity rings 25 are stacked on top of each other inside an insulating member 14. One or both sides 26 of each ring is metallized.

As described thus far, a magnetic-electrostatic compound objective lens according to this invention comprises a substantially conically-shaped magnetic pole piece, a coil wound along the inner surface of the magnetic pole piece, a hollow insulator disposed along the inner surface of the coil, and a high-resistivity body disposed along the inner surface of the insulator. The magnetic pole piece surrounds an electron beam path. The high-resistivity body has two ends spaced from each other along the electron beam path. A voltage is applied between these two ends of the high-resistivity body to produce an electric field for retarding electrons. An electrostatic lens action occurs at a position closer to a specimen than the position of the peak of the magnetic flux density created by the magnetic lens. As a consequence, the spherical aberration Cs and chromatic aberration Cc can be suppressed greatly. Hence, a high-resolution objective lens can be provided.

In an alternate embodiment of the magnetic-electrostatic compound objective lens according to this invention, the high-resistivity body assumes the form of a film. This magnetic-electrostatic compound objective lens yields the same advantages.

In yet another embodiment of the magnetic-electrostatic compound objective lens according to this invention, the high-resistivity body is made of a pipe. This objective lens yields the same advantages. In addition, this lens is easy to manufacture.

In still another embodiment, the plurality of ring-shaped conductors are disposed inside the high-resistivity body to compensate for disturbance caused by nonuniformity of the high-resistivity body.

A magnetic-electrostatic compound objective lens according to this invention may comprise a substantially conically-shaped magnetic pole piece, a coil wound along the inner surface of the magnetic pole piece, a hollow insulator disposed along the inner surface of the coil and a lamination disposed along the inner surface of the insulator. The magnetic pole piece surrounds an electron beam path. The lamination consists of ring-shaped high-resistivity members and conductive members alternately stacked on top of each other. The lamination has two ends which are spaced from each other along the electron beam path. A voltage is applied between these two ends of the high-resistivity body to produce an electric field for retarding electrons. An electrostatic lens action occurs at a position closer to a specimen than the position of the peak of the magnetic flux density of the magnetic lens. As a consequence, the spherical aberration Cs and chromatic aberration Cc can be suppressed greatly. Hence, a high-resolution objective lens can be provided.

A magnetic-electrostatic compound objective lens according to this invention may comprise a substantially conically-shaped magnetic pole piece, a coil wound along the inner surface of the magnetic pole piece, a hollow insulator disposed along the inner surface of the coil and a lamination disposed along the inner surface of the insulator. The magnetic pole piece surrounds an electron beam path. The lamination comprises a number of ring-shaped high-resistivity members and metal members inserted between the successive high-resistivity members. The lamination has two ends spaced from each other along the electron beam path. A voltage is applied between these two ends of the high-resistivity body to produce an electric field for retarding electrons. An electrostatic lens action occurs at a position closer to a specimen than the position of the peak of the magnetic flux density created by the magnetic lens. As a consequence, the spherical aberration Cs and chromatic aberration Cc can be suppressed greatly. Hence, a high-resolution objective lens can be provided.

A magnetic-electrostatic compound objective lens according to this invention may be characterized by a heat-dissipating material disposed between the coil and the high-resistivity body or lamination to efficiently dissipate heat from the coil. Thus, the lens is prevented from being adversely affected by the heat.

Having thus described my invention with the detail and particularity required by the Patent Laws, what is desired protected by Letters Patent is set forth in the following claims.

What is claimed is:

1. A magnetic-electrostatic compound objective lens for use in an instrument having an electron beam path, said objective lens comprising:
   a substantially conically-shaped magnetic pole piece surrounding said electron beam path and having a radially inward inner surface facing the beam path;
   a coil wound along the inner surface of said magnetic pole piece, said coil having a radially inward inner surface;
   a hollow insulator disposed along the inner surface of said coil, said insulator having a radially inward inner surface;
   a high-resistivity body disposed along the inner surface of said insulator, said high-resistivity body having two ends spaced from each other along the electron beam path; and
   a means for applying a voltage between said two ends of said high-resistivity body to produce an electric current in said high-resistivity body such that a symmetrical electric field for retarding electrons is established.

2. The magnetic-electrostatic compound objective lens of claim 1, wherein said high-resistivity body assumes the form of a film.

3. The magnetic-electrostatic compound objective lens of claim 1, wherein said high-resistivity body is shaped like a pipe.

4. The magnetic-electrostatic compound objective lens of claim 1, wherein a plurality of ring-shaped conductors are disposed inside said high-resistivity body.

5. A magnetic-electrostatic compound objective lens for use in an instrument having an electron beam path, said objective lens comprising:
   a substantially conically-shaped magnetic pole piece surrounding said electron beam path and having a radially inward inner surface facing the beam path;
   a coil wound along the inner surface of said magnetic pole piece, said coil having a radially inward inner surface;
   a hollow insulator disposed along the inner surface of said coil, said insulator having a radially inward inner surface;
   a lamination disposed along the inner surface of said insulator and consisting of ring-shaped high-resistivity members and conductive members alternately stacked on top of each other, said lamination having two ends spaced from each other along the electron beam path; and
   a means for applying a voltage between said two ends of said lamination to produce an electric current in said lamination such that a symmetrical electric field for retarding electrons is established.

6. A magnetic-electrostatic compound objective lens for use in an instrument having an electron beam path, said objective lens comprising:
   a substantially conically-shaped magnetic pole piece surrounding said electron beam path and having a radially inward inner surface facing the beam path;
   a coil wound along the inner surface of said magnetic pole piece, said coil having a radially inward inner surface;
   a hollow insulator disposed along the inner surface of said coil, said insulator having a radially inward inner surface;
   a lamination disposed along the inner surface of said insulator and comprising a number of ring-shaped high-resistivity members and metal members inserted between the successive ring-shaped high-resistivity members, said lamination having two ends spaced from each other along the electron beam path; and
   a means for applying a voltage between said two ends of said lamination to produce an electric current in said lamination such that a symmetrical electric field for retarding electrons is established.

7. The magnetic-electrostatic compound objective lens of any one of claims 1–6, wherein a heat-dissipating material is disposed between said coil and said high-resistivity body or lamination.

8. The magnetic-electrostatic compound objective lens of any one of claims 1–6, wherein said substantially conically-shaped magnetized body has a cone angle of about 60°.

9. A magnetic-electrostatic compound objective lens for use in an instrument having an electron beam path, said objective lens comprising:
   a substantially conically-shaped magnetic pole piece surrounding said electron beam path and having a radially inward inner surface facing the beam path;
   a coil wound along the inner surface of said magnetic pole piece, said coil having a radially inward inner surface;
   a hollow insulator disposed along the inner surface of said coil, said insulator having a radially inward inner surface;
   a plurality of ring-shaped conductive members disposed along the inner surface of said insulator leaving out space between conductive members, said conductive members being electrically connected to each other via resistive bodies; and
   a means for applying a voltage across conductive members and resistive bodies to produce an electric current in said conductive members and resistive bodies such that a symmetrical electric field for retarding electrons is established.

* * * * *

UNITED STATES PATENT AND TRADEMARK OFFICE
CERTIFICATE OF CORRECTION

PATENT NO. : 5,731,586
DATED : March 24, 1998
INVENTOR(S) : Susumu Takashima

It is certified that error appears in the above-identified patent and that said Letters Patent is hereby corrected as shown below:

Column 7 Lines 30-31 "$\Omega.\text{cm}$" should read --$\Omega\bullet\text{cm}$--.

Signed and Sealed this

Fifteenth Day of September, 1998

Attest:

BRUCE LEHMAN

*Attesting Officer*   *Commissioner of Patents and Trademarks*

UNITED STATES PATENT AND TRADEMARK OFFICE
CERTIFICATE OF CORRECTION

PATENT NO. : 5,731,586
DATED : March 24, 1998
INVENTOR(S) : Takashima

It is certified that error appears in the above-identified patent and that said Letters Patent is hereby corrected as shown below:

On the title page, insert:
-- [30] Foreign Application Priority Data
May 25, 1995...[JP]   Japan.....7-126339 --.

Signed and Sealed this

Thirteenth Day of October 1998

Attest:

BRUCE LEHMAN

*Attesting Officer*            *Commissioner of Patents and Trademarks*